(12) United States Patent
Nishimori et al.

(10) Patent No.: US 12,075,567 B2
(45) Date of Patent: Aug. 27, 2024

(54) ELECTRONIC APPARATUS AND PROXIMITY SENSOR

(71) Applicant: OMRON Corporation, Kyoto (JP)

(72) Inventors: Naoki Nishimori, Kyoto (JP); Yuki Ushiro, Kyoto (JP); Yusuke Nakayama, Kyoto (JP); Daisuke Inoue, Kyoto (JP)

(73) Assignee: OMRON Corporation, Kyoto (JP)

( * ) Notice: Subject to any disclaimer, the term of this patent is extended or adjusted under 35 U.S.C. 154(b) by 218 days.

(21) Appl. No.: 17/798,086

(22) PCT Filed: Jan. 20, 2021

(86) PCT No.: PCT/JP2021/001782
§ 371 (c)(1),
(2) Date: Aug. 8, 2022

(87) PCT Pub. No.: WO2021/181898
PCT Pub. Date: Sep. 16, 2021

(65) Prior Publication Data
US 2023/0094727 A1   Mar. 30, 2023

(30) Foreign Application Priority Data

Mar. 10, 2020  (JP) ................................. 2020-040797

(51) Int. Cl.
*H05K 1/11*     (2006.01)
*H05K 3/36*     (2006.01)

(52) U.S. Cl.
CPC ............. *H05K 1/118* (2013.01); *H05K 3/363* (2013.01)

(58) Field of Classification Search
None
See application file for complete search history.

(56) References Cited

U.S. PATENT DOCUMENTS 7,304,373 B2 *  12/2007  Taggart ................... H01L 23/50
                                                  257/E23.079
7,364,440 B2 *   4/2008  Gobron .................. H01R 12/77
                                                  439/77
(Continued)

FOREIGN PATENT DOCUMENTS

JP    S58134844    9/1983
JP    H06152092    5/1994
(Continued)

OTHER PUBLICATIONS

"International Search Report (Form PCT/ISA/210) of PCT/JP2021/001782," mailed on Apr. 20, 2021, with English translation thereof, pp. 1-4.

(Continued)

*Primary Examiner* — Xanthia C Relford
(74) *Attorney, Agent, or Firm* — JCIPRNET

(57) ABSTRACT

An electronic apparatus includes: a hard substrate having a first surface with a first wiring layer terminal, a second surface positioned on a back side of the first surface, and an end surface having a second wiring layer terminal and being continuous with the first surface and the second surface; and a flexible substrate having a third surface with a third wiring layer terminal and opposing the first surface of the hard substrate, and a fourth surface having a fourth wiring layer terminal and positioned on a back side of the third surface. The first wiring layer terminal and the fourth wiring layer terminal are electrically connected by solder. The second wiring layer terminal and the third wiring layer terminal are electrically connected by solder.

20 Claims, 6 Drawing Sheets

(56) References Cited

U.S. PATENT DOCUMENTS

| | | | |
|---|---|---|---|
| 7,479,345 B2* | 1/2009 | Nakamura | H01R 12/52 |
| | | | 429/129 |
| 7,606,041 B2* | 10/2009 | Park | H05K 3/363 |
| | | | 429/129 |
| 8,562,149 B2* | 10/2013 | Hu | G03B 21/145 |
| | | | 353/57 |
| 9,905,950 B2* | 2/2018 | Marsh | H01R 4/58 |
| 2007/0126123 A1* | 6/2007 | Sawachi | H05K 3/4691 |
| | | | 257/777 |
| 2007/0197058 A1* | 8/2007 | Kitada | H05K 3/363 |
| | | | 439/76.2 |
| 2014/0287616 A1* | 9/2014 | Chen | H01R 13/5812 |
| | | | 439/493 |
| 2015/0325937 A1* | 11/2015 | Mikage | H01R 12/78 |
| | | | 439/493 |
| 2019/0150711 A1* | 5/2019 | Chiu | A61B 1/00105 |

FOREIGN PATENT DOCUMENTS

| | | |
|---|---|---|
| JP | 2003518394 | 6/2003 |
| JP | 2004031870 | 1/2004 |
| JP | 2006236948 | 9/2006 |
| JP | 2006245108 | 9/2006 |

OTHER PUBLICATIONS

"Written Opinion of the International Searching Authority (Form PCT/ISA/237)" of PCT/JP2021/001782, mailed on Apr. 20, 2021, with English translation thereof, pp. 1-8.

"Office Action of Japan Counterpart Application", issued on Feb. 9, 2024, with English translation thereof, pp. 1-6.

"Office Action of China Counterpart Application", issued on Jan. 24, 2024, with English translation thereof, pp. 1-21.

* cited by examiner

ELECTRONIC APPARATUS AND PROXIMITY SENSOR

CROSS-REFERENCE TO RELATED APPLICATION

This application is a 371 application of the International PCT application serial no. PCT/JP2021/001782, filed on Jan. 20, 2021, which claims the priority benefits of Japan Patent Application No. 2020-040797, filed on Mar. 10, 2020. The entirety of each of the above-mentioned patent applications is hereby incorporated by reference herein and made a part of this specification.

TECHNICAL FIELD

The disclosure relates to an electronic apparatus and a proximity sensor.

RELATED ART

Conventionally, in an electronic apparatus, a wiring layer provided on a hard substrate and a wiring layer provided on a flexible substrate have been connected. For example, Patent Literature 1 describes a method for connecting a flexible wiring substrate.

CITATION LIST

Patent Literature

[Patent Literature 1] Japanese Patent Application Laid-Open No. 2006-245108

SUMMARY

Technical Problem

However, as the number of connection points between the wiring layers increases, the space required for soldering on the surface of the hard substrate also increases, which makes it difficult to reduce the size of the electronic apparatus.

Therefore, the disclosure provides an electronic apparatus and a proximity sensor with which it is possible to achieve overall size reduction while ensuring a component mounting space on a hard substrate.

Solution to Problem

An electronic apparatus according to an embodiment of the disclosure includes a hard substrate having a first surface provided with a terminal of a first wiring layer, a second surface located on a back side of the first surface, and an end surface provided with a terminal of a second wiring layer and being continuous with the first surface and the second surface; and a flexible substrate having a third surface provided with a terminal of a third wiring layer and facing the first surface of the hard substrate; and a fourth surface provided with a terminal of a fourth wiring layer and located on a back side of the third surface. The terminal of the first wiring layer provided on the first surface of the hard substrate and the terminal of the fourth wiring layer provided on the fourth surface of the flexible substrate are electrically connected by solder, and the terminal of the second wiring layer provided on the end surface of the hard substrate and the terminal of the third wiring layer provided on the third surface of the flexible substrate are electrically connected by solder.

According to this embodiment, it is possible to reduce the size of the electronic apparatus as a whole while securing a space for mounting a component on the hard substrate.

In the above embodiment, the flexible substrate may be curved so that the third surface applies a restoring force to the first surface of the hard substrate.

According to this embodiment, since the flexible substrate is fixed so as to apply a restoring force to the first surface of the hard substrate via the third surface, the third surface of the flexible substrate is more firmly fixed to the first surface of the hard substrate.

In the above embodiment, the flexible substrate may have a curved part in which the third surface is disposed on an outer side and the fourth surface is disposed on an inner side.

According to this embodiment, since the flexible substrate is fixed so as to apply a restoring force to the first surface of the hard substrate via the third surface, the third surface of the flexible substrate is more firmly fixed to the first surface of the hard substrate.

In the above embodiment, the terminal of the second wiring layer may be provided in a recess of the end surface.

According to this embodiment, for example, the hard substrate may be manufactured by forming a through hole in a base material and then dividing the base material by the through hole, whereby it is possible to simplify a manufacturing method of the electronic apparatus.

In the above embodiment, the recess may configure a substantially cylindrical surface whose axial direction is a direction substantially perpendicular to the first surface and the second surface.

According to this embodiment, for example, the hard substrate may be manufactured by forming a through hole in a base material and then dividing the base material by the through hole, whereby it is possible to simplify a manufacturing method of the electronic apparatus.

In the above embodiment, the second wiring layer may be provided on the second surface of the hard substrate and/or inside the hard substrate.

According to this embodiment, the second wiring layer may be provided on the surface of the hard substrate and/or inside the hard substrate, and the degree of freedom of wiring is increased.

In the above embodiment, the number of terminals of the second wiring layer and terminals of the third wiring layer that are electrically connected to each other is greater than the number of terminals of the first wiring layer and terminals of the fourth wiring layer that are electrically connected to each other.

According to this embodiment, the hard substrate and the flexible substrate may be connected with a small amount of solder.

Effects of Invention

According to the disclosure, it is possible to provide an electronic apparatus and a proximity sensor capable of reducing the number of parts and reducing the space for connecting the wiring layers.

DESCRIPTION OF THE EMBODIMENTS

Figure 1:
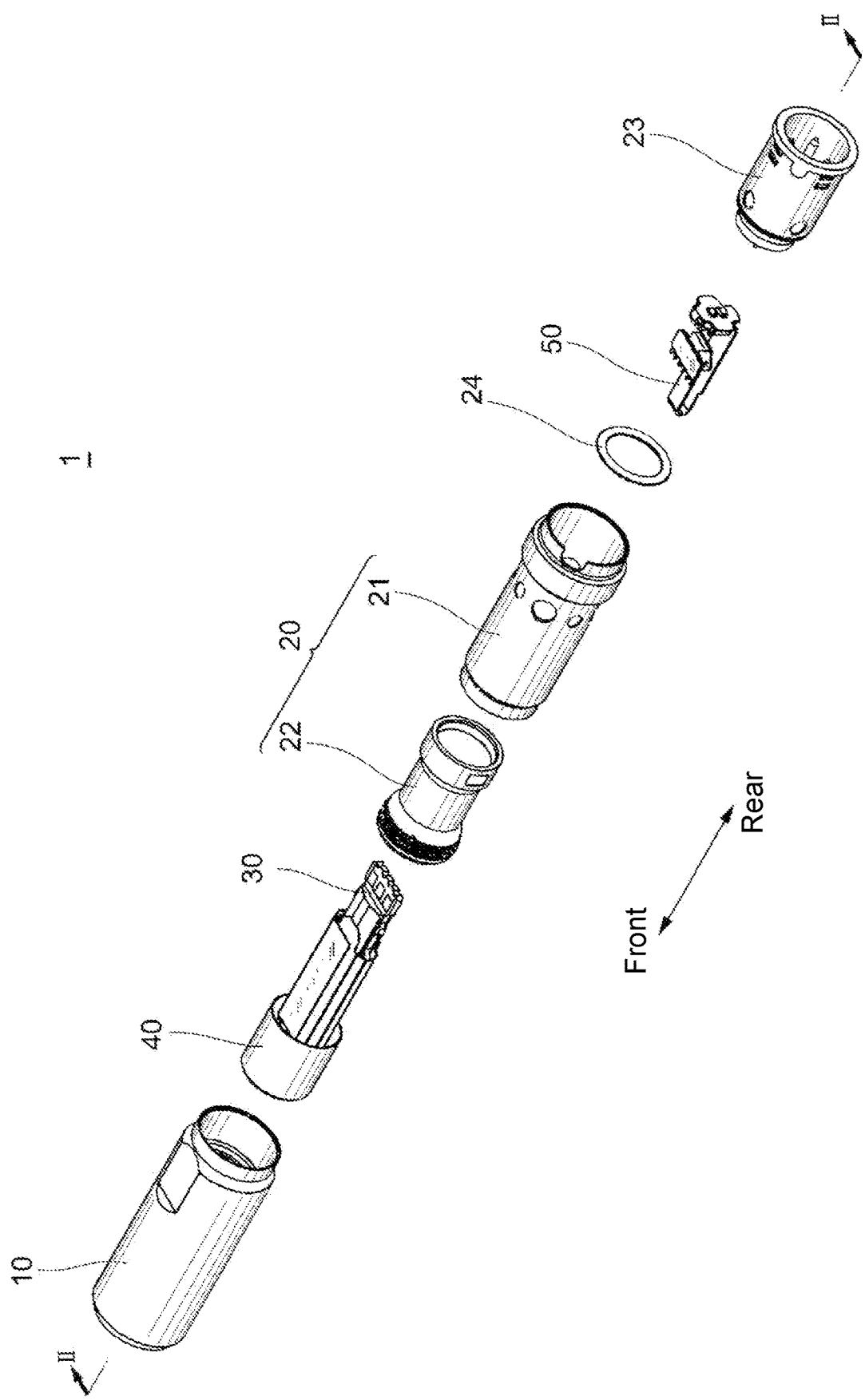
FIG. 1 is an exploded perspective view of the sensor 1 according to an embodiment of the disclosure.

An embodiment of the disclosure will be described with reference to the accompanying drawings. In each figure, those with the same reference numerals have the same or similar configurations.

Figure 2:
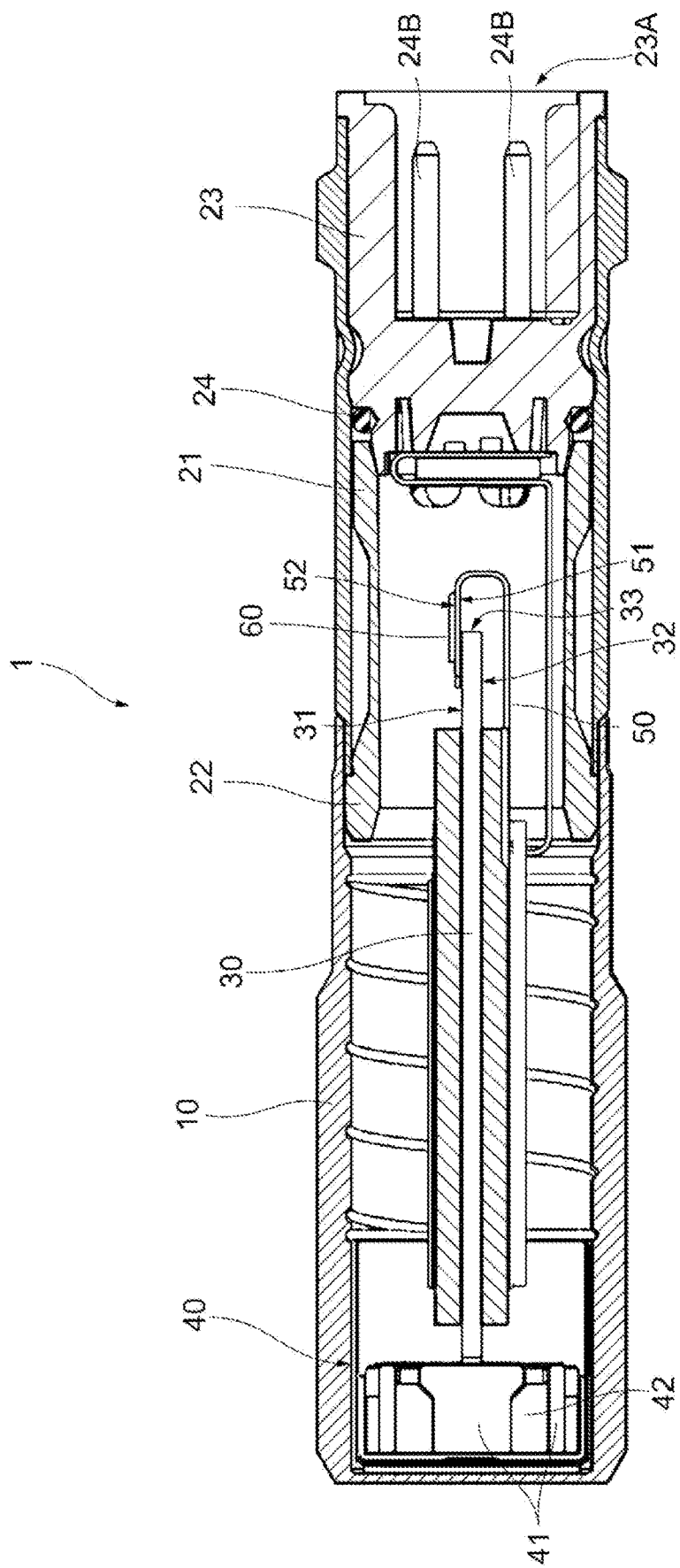
FIG. 2 is a cross-sectional view taken along the line II-II in a state where the sensor 1 shown in FIG. 1 is assembled.

The internal structure of a sensor 1 will be described with reference to FIGS. 1 and 2. FIG. 1 is an exploded perspective view of the sensor 1 according to an embodiment of the disclosure. FIG. 2 is a cross-sectional view taken along the line II-II in a state where the sensor 1 shown in FIG. 1 is assembled. As shown by the arrow in FIG. 1, along the axial direction of the sensor 1, the direction from a clamp 20 to a housing 10 is the front, and the direction from the housing 10 to the clamp 20 is the rear.

The sensor 1 according to this embodiment is a proximity sensor capable of detecting that a detection target is approaching in a non-contact manner, and includes the housing 10, the clamp 20, a connector 23, an O-ring 24, a hard substrate 30, a detection part 40, a flexible substrate 50, a reinforcing plate 60, and the like. The housing 10 is formed in a tubular shape, and electronic components such as the hard substrate 30 and the detection part 40 are housed inside the housing 10. The housing 10 has an opening on the rear side, and electronic components such as the hard substrate 30 and the detection part 40 are inserted from the opening. The housing 10 may be made of metal, resin, or the like. The outer shape of the sensor 1 is a columnar shape, but the outer circumference of the housing 10 or the clamp 20 may be a polygonal shape.

The clamp 20 has an outer member 21 having a substantially cylindrical shape and an inner member 22 having a substantially cylindrical shape. The inner member 22 is fitted into the inside of the outer member 21 from the front side, and the end part of the inner member 22 is connected to the opening of the housing 10. Further, the connector 23 is fitted into the inside of the outer member 21 from the rear side via the O-ring 24. A terminal provided at one end of the flexible substrate 50 is connected to the front end of the connector 23.

The hard substrate 30 is a substrate on which a control circuit (not shown) for controlling the detection part 40 and a current supply circuit (not shown) for supplying current to the detection part 40 are mounted, and a part thereof is housed in the housing 10. As shown in FIG. 2, the detection part 40 is attached to the front end of the hard substrate 30. For example, a rigid wiring substrate using a glass-epoxy resin-based material as a base material is used as the hard substrate 30. The detection part 40 detects the presence or absence of a detection target in a non-contact manner. The detection part 40 includes a core 41 in which a coil 42 is housed, and a coil 42 wound in an annular shape. In addition, as will be described later, a terminal is provided at the rear end of the hard substrate 30, and the terminal is electrically connected to a terminal provided at one end of the flexible substrate 50.

A method of detecting a detection target by the sensor 1 will be described. First, an exciting current is supplied to the coil 42 from the current supply circuit mounted on the hard substrate 30. The coil 42 generates a magnetic field based on the supplied exciting current. When a detection target such as metal approaches the coil 42 in this state, an eddy current is generated inside the detection target according to the law of electromagnetic induction. Since this eddy current generates a magnetic field, the magnetic flux penetrating the coil 42 and the impedance of the coil 42 change. The control circuit connected to the detection part 40 measures the change in the impedance of the coil 42 and detects the presence or absence of the detection target.

As shown in FIG. 2, the flexible substrate 50 has a third surface 51 and a fourth surface 52, and is curved in a substantially S shape in a cross-sectional view. One end of the flexible substrate 50 is placed on the hard substrate 30 to make the fourth surface 52 contact a first surface 31 of the hard substrate 30 (in addition to direct contact, it also includes cases where contact is made via a wiring layer and the like, and cases where a gap is included in a part of the contact). The other end of the flexible substrate 50 is electrically connected to the connector 23. For example, a wiring substrate using a polyimide resin-based material which is a heat-resistant resin as a base material is used as the flexible substrate 50. The space provided with the flexible substrate 50 in the sensor 1 may be sealed with a predetermined resin. The reinforcing plate 60 is placed on the fourth surface 52 of the flexible substrate 50. When the flexible substrate 50 is distorted, stress is generated in the soldered part and the part also tends to be distorted, but the reinforcing plate 60 makes it possible to suppress the distortion of the soldered part.

The connector 23 may supply electric power from an external power supply to the circuits mounted on the hard substrate 30 and the flexible substrate 50. Further, the connector 23 may transmit an output signal from the control circuit mounted on the hard substrate 30 and the flexible substrate 50 to an external device such as an amplifier.

Figure 3:
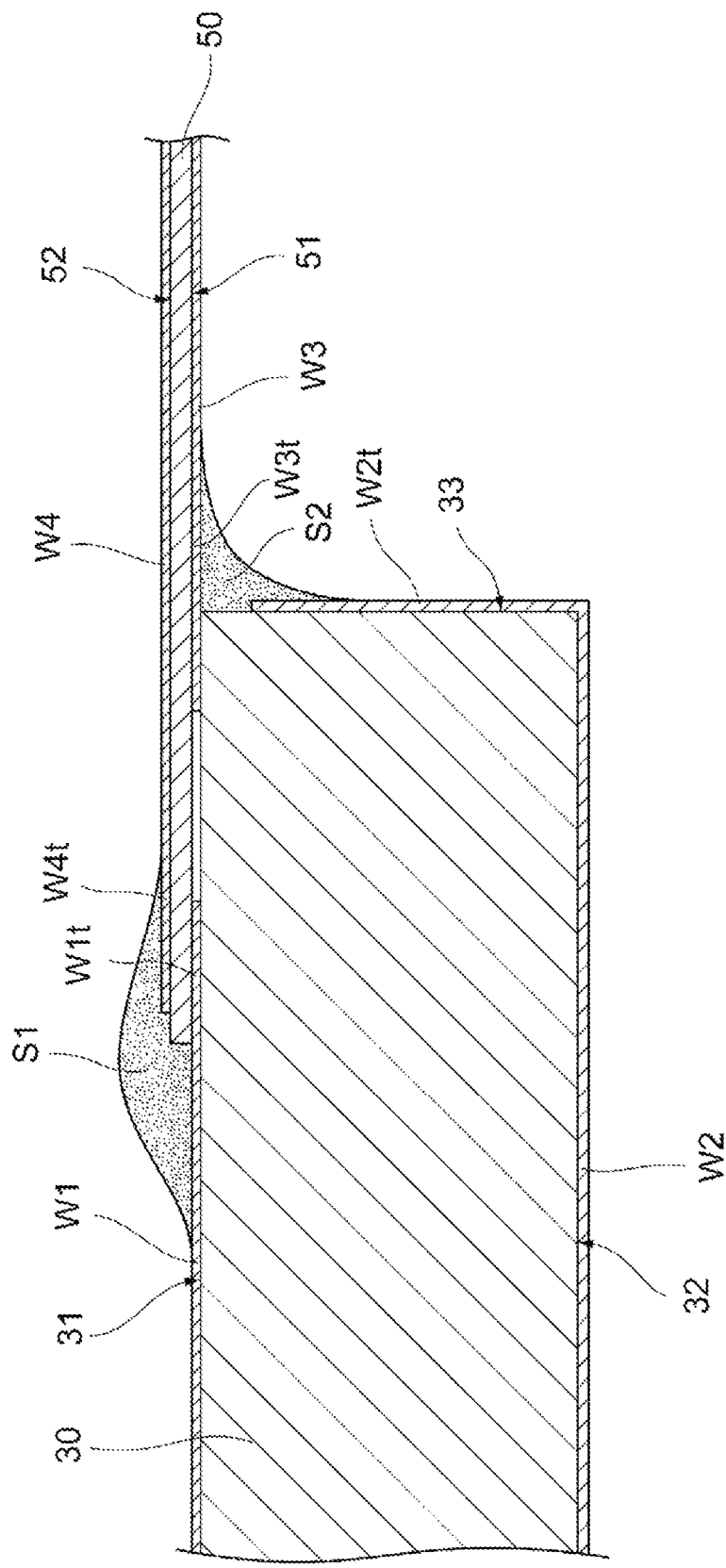
FIG. 3 is a view showing a part in which one end of the flexible substrate 50 is placed on one end of the hard substrate 30.

Next, the connection structure of the hard substrate 30 and the flexible substrate 50 will be described with reference to FIG. 3. FIG. 3 shows a part in which one end of the flexible substrate 50 is placed on one end of the hard substrate 30. As shown in FIG. 3, the hard substrate 30 has a first surface 31, a second surface 32, and an end surface 33. The first surface 31 is disposed on the side facing the flexible substrate 50. The second surface 32 is disposed on the side that does not face the flexible substrate 50, that is, on the back side of the first surface 31. The end surface 33 is disposed to be continuous with the first surface 31 and the second surface 32 at the end part of the hard substrate 30.

A wiring layer W1 (first wiring layer W1) is provided on at least a part of the first surface 31 of the hard substrate 30. A terminal W1t, which is a solder joint region, is provided in a part of the wiring layer W1. A wiring layer W2 (second wiring layer W2) is provided over at least a part of the second surface 32 and at least a part of the end surface 33 of the hard substrate 30. A terminal W2t, which is a solder joint region, is provided in a part of the wiring layer W2 disposed on the end surface 33. The wiring layers W1 and W2 and the like are formed, for example, by patterning copper attached to the main surface of a base material with an adhesive.

The flexible substrate 50 has the third surface 51 and the fourth surface 52. The third surface 51 is disposed on the side facing the hard substrate 30. The fourth surface 52 is disposed on the side that does not face the hard substrate 30, that is, on the back side of the third surface 51. A wiring layer W3 (third wiring layer W3) is provided on at least a part of the third surface 51. A wiring layer W4 (fourth wiring layer W4) is provided on at least a part of the fourth surface 52. The wiring layers W3, W4, and the like are formed by, for example, tin-plating the surface of a copper foil attached to the main surface of a base material with an adhesive.

The end of the third surface 51 of the flexible substrate 50 is disposed on at least a part of the first surface 31 of the hard substrate 30. A solder S1 extends over the terminal W1t of the wiring layer W1 provided on the first surface 31 of the hard substrate 30 and the terminal W4t of the wiring layer W4 provided on the fourth surface 52 of the flexible substrate 50. As a result, the solder S1 electrically connects the terminal W1t and the terminal W4t.

A solder S2 extends over the terminal W2t of the wiring layer W2 provided on the end surface 33 of the hard substrate 30 and the terminal W3t of the wiring layer W3 provided on the third surface 51 of the flexible substrate 50. As a result, the solder S2 electrically connects the terminal W2t and the terminal W3t.

Figure 4A:
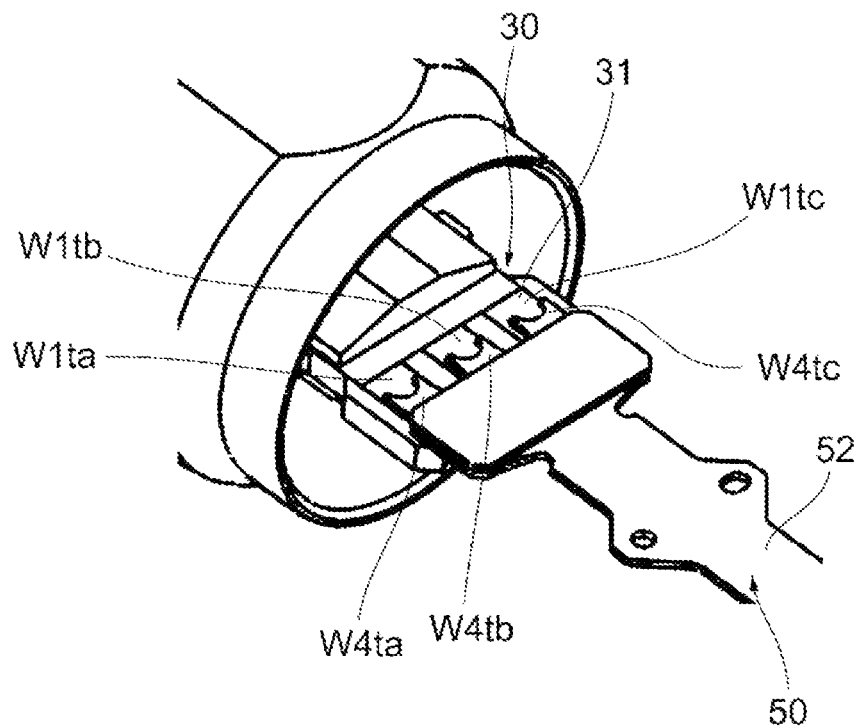
FIG. 4A is a perspective view of the first surface 31 of the hard substrate 30 and the fourth surface 52 of the flexible substrate 50 as viewed obliquely.
Figure 4B:
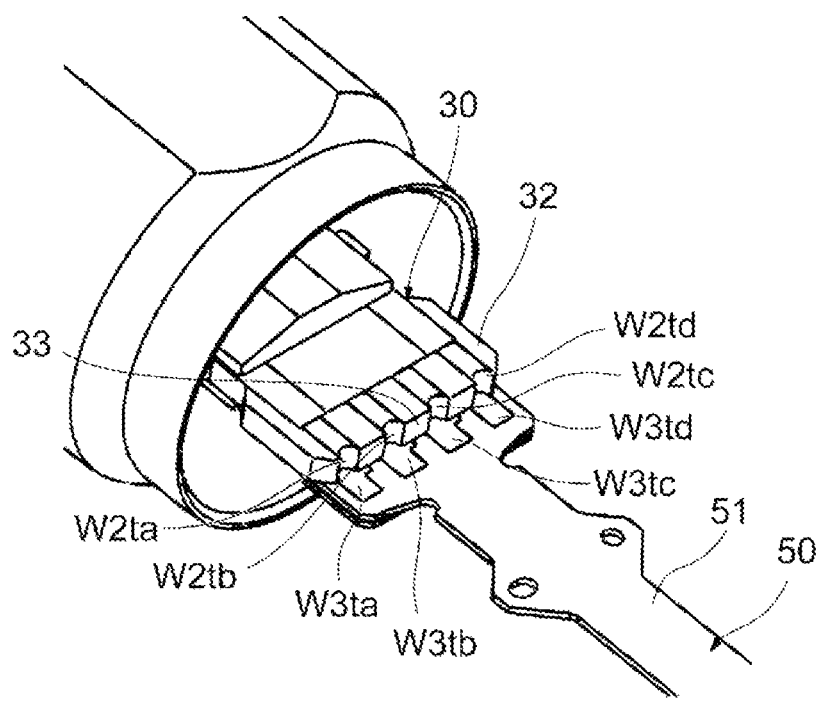
FIG. 4B is a perspective view of the second surface 32 of the hard substrate 30 and the third surface 51 of the flexible substrate 50 as viewed obliquely.

Next, with reference to FIGS. 4A and 4B, the number of terminals in the connection structure of the hard substrate 30 and the flexible substrate 50 will be described. FIG. 4A is a perspective view of the first surface 31 of the hard substrate 30 and the fourth surface 52 of the flexible substrate 50 as viewed obliquely. FIG. 4B is a perspective view of the second surface 32 of the hard substrate 30 and the third surface 51 of the flexible substrate 50 as viewed obliquely.

As shown in FIG. 4A, the first surface 31 of the hard substrate 30 is provided with three terminals W1ta, W1tb, and W1tc of the wiring layer W1. Further, the fourth surface 52 of the flexible substrate 50 is provided with three terminals W4ta, W4tb, and W4tc of the wiring layer W4. Then, as described with reference to FIG. 3, the terminal W1ta is electrically connected to the terminal W4ta; the terminal W1tb is electrically connected to the terminal W4tb; and the terminal W1tc is electrically connected to the terminal W4tc. That is, the wiring layer W1 of the hard substrate 30 and the wiring layer W4 of the flexible substrate 50 are electrically connected by three terminals.

As shown in FIG. 4B, the end surface 33 of the hard substrate 30 is provided with four terminals W2ta, W2tb, W2tc, and W2td of the wiring layer W2. Further, the third surface 51 of the flexible substrate 50 is provided with four terminals W3ta, W3tb, W3tc, and W3td of the wiring layer W3. Then, as described with reference to FIG. 3, the terminal W2ta is electrically connected to the terminal W3ta; the terminal W2tb is electrically connected to the terminal W3tb; the terminal W2tc is electrically connected to the terminal W3tc; and the terminal W2td is electrically connected to the terminal W3td. That is, the wiring layer W2 of the hard substrate 30 and the wiring layer W4 of the flexible substrate 50 are electrically connected by four terminals.

The first surface 31 of the hard substrate 30 and the fourth surface 52 of the flexible substrate 50 on which the solder S1 is provided are disposed substantially parallel to each other. In addition, the end surface 33 of the hard substrate 30 and the third surface 51 of the flexible substrate 50 on which the solder S2 is provided are disposed substantially perpendicular to each other. Therefore, the solder S2 may suppress the spread to be smaller than that of the solder S1. As described above, the number of terminals (4) connected by the solder S2 is greater than the number of terminals (3) connected by the solder S1. This makes it possible to connect the hard substrate 30 and the flexible substrate 50 with a small amount of solder.

Each of the terminals W2ta, W2tb, W2tc, and W2td of the wiring layer W2 provided on the end surface 33 of the hard substrate 30 and the like may be generated, for example, by forming a through hole with respect to the base material of the hard substrate 30 and dividing the base material at the part of the through hole.

Figure 5:
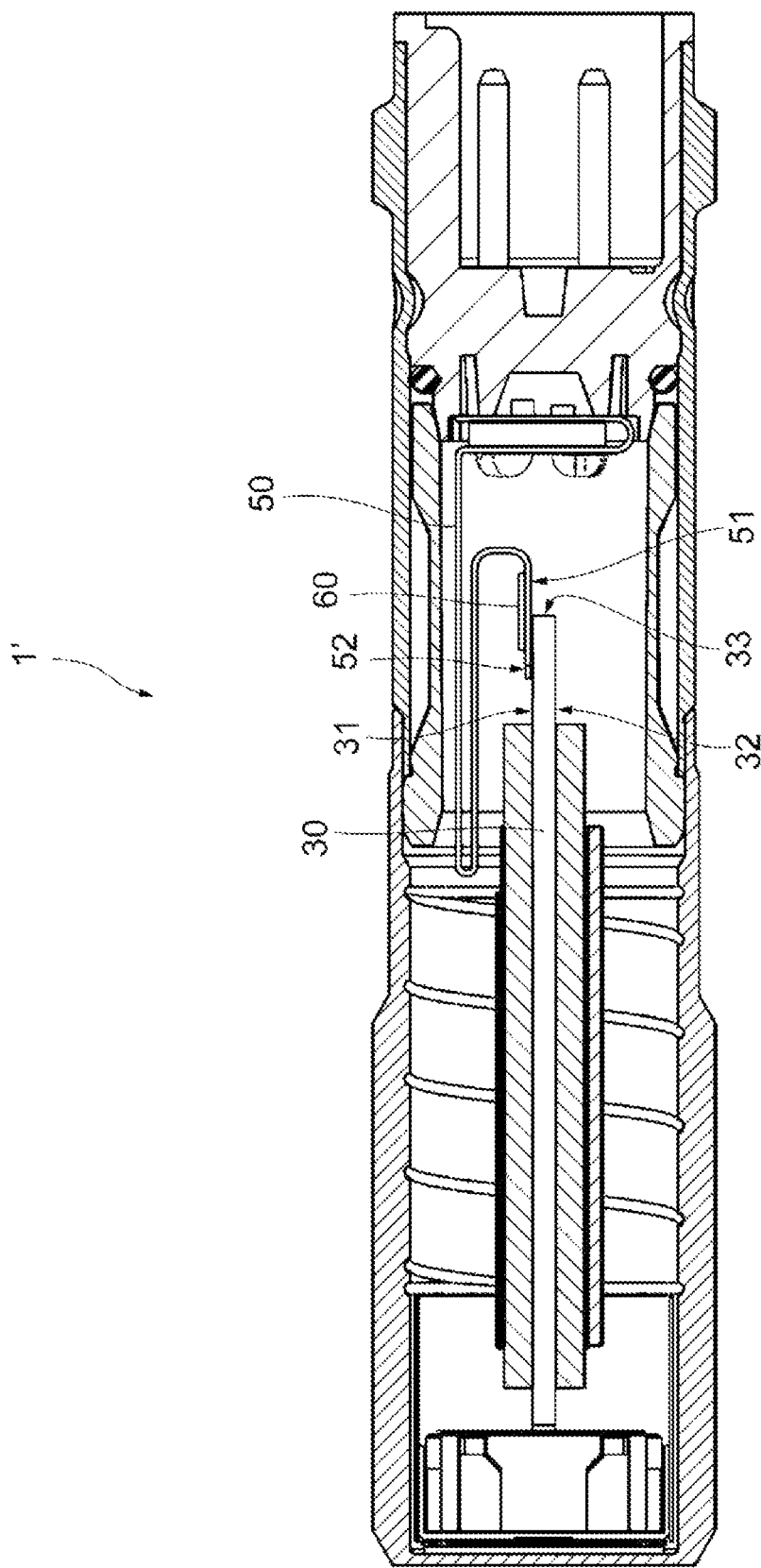
FIG. 5 is a cross-sectional view corresponding to FIG. 2 of a sensor 1' according to another embodiment of the disclosure.

FIG. 5 is a cross-sectional view corresponding to FIG. 2 of a sensor 1' according to another embodiment of the disclosure. In the sensor 1', the flexible substrate 50 is curved to apply a restoring force to the hard substrate 30. That is, the flexible substrate 50 has a curved part in which the third surface 51 is disposed on the outside and the fourth surface 52 is disposed on the inside. As a result, the flexible substrate 50 has a restoring force that tries to restore the curvature of the curved part. Then, the restoring force is applied from the third surface 51 of the flexible substrate 50 to the first surface 31 of the hard substrate 30 facing the third surface 51. As a result, the connection between the hard substrate 30 and the flexible substrate 50 becomes stronger.

Figure 6:
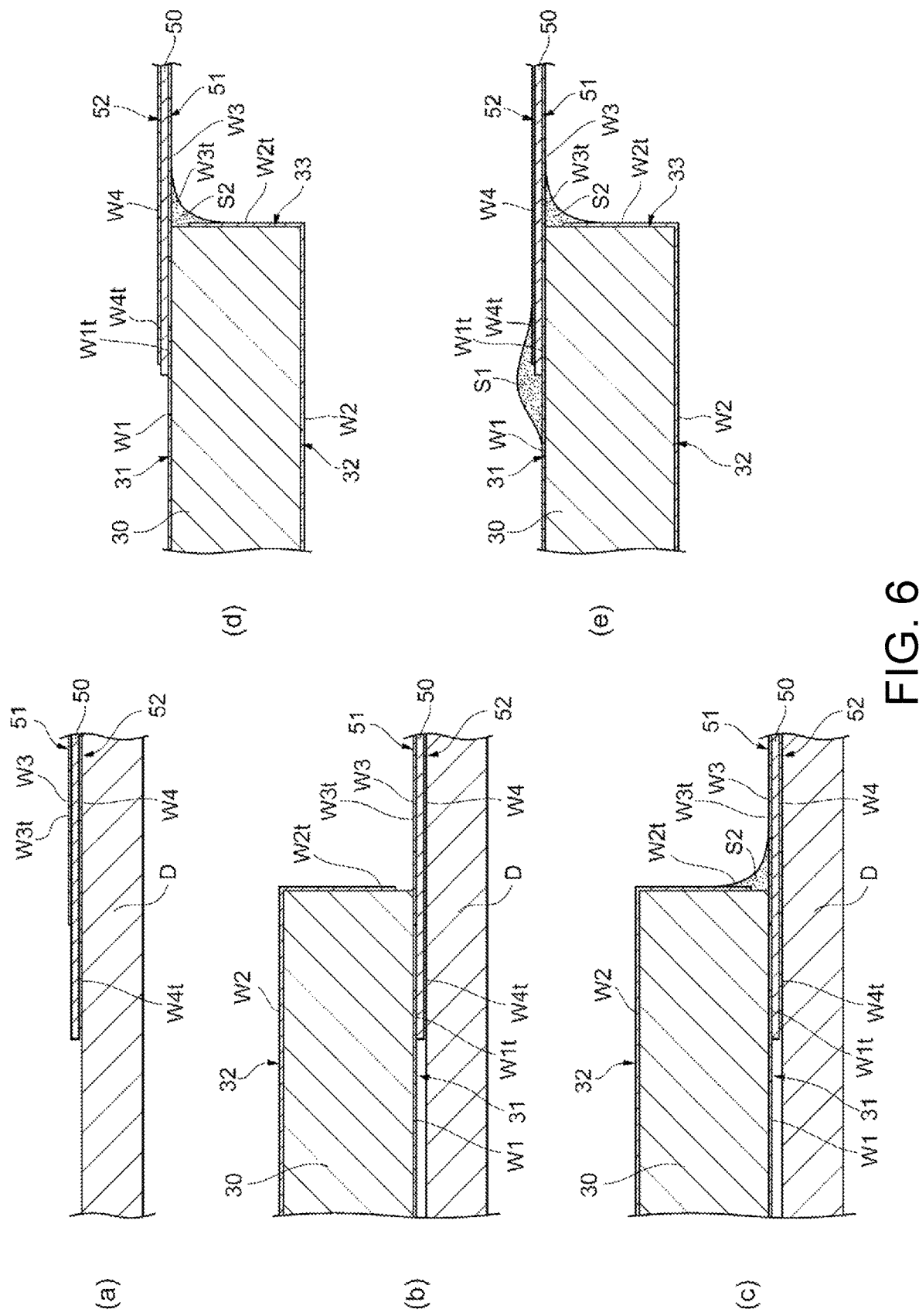
FIG. 6 is a view for illustrating a method of connecting the hard substrate 30 and the flexible substrate 50 according to an embodiment of the disclosure.

FIG. 6 is a view for illustrating a method of connecting the hard substrate 30 and the flexible substrate 50 according to an embodiment of the disclosure. In addition, FIG. 3 is drawn to illustrate the connection structure of the hard substrate 30 and the flexible substrate 50 according to an embodiment of the disclosure, and it should be noted that in the following procedures (1) to (4), the state is turned upside down with respect to the state shown in FIG. 3.

(1) First, as shown in (a) of FIG. 6, the flexible substrate 50 is placed on a flat table D with the third surface 51 facing upward.

(2) Next, as shown in (b) of FIG. 6, the hard substrate 30 is placed on the flexible substrate 50 with the first surface 31 facing downward to face the flexible substrate 50.

(3) Further, as shown in (b) of FIG. 6, the position of the hard substrate 30 is adjusted so that the terminal W2t of the wiring layer W2 provided on the end surface 33 of the hard substrate 30 and the terminal W3t of the wiring layer W3 provided on the third surface 51 of the flexible substrate 50 have a positional relationship that allows soldering.

(4) Next, as shown in (c) of FIG. 6, the solder S2 is formed to cover the terminal W2t of the wiring layer W2 provided on the end surface 33 of the hard substrate 30 and the terminal W3t of the wiring layer W3 provided on the third surface 51 of the flexible substrate 50, and the terminal W2t and the terminal W3t are electrically connected by the solder S2. At the time of soldering, it is desirable to press the hard substrate 30 downward to bring the wiring layer W2 and the wiring layer W3 into close contact with each other.

(5) Next, the hard substrate 30 and the flexible substrate 50 in which the terminal W2t of the wiring layer W2 and the terminal W3t of the wiring layer W3 are connected by the solder S2 are turned upside down so that the first surface 31 of the hard substrate 30 faces upward.

(6) Next, the solder S1 is formed to cover the terminal W1*t* of the wiring layer W1 provided on the first surface 31 of the hard substrate 30 and the terminal W4*t* of the wiring layer W4 provided on the fourth surface 52 of the flexible substrate 50, and the terminal W1*t* and the terminal W4*t* are electrically connected by the solder S1.

By forming the connection structure between the hard substrate 30 and the flexible substrate 50 using such a procedure, soldering may be performed in a state where the terminal W2*t* of the wiring layer W2 provided on the end surface 33 of the hard substrate 30 and the terminal W3*t* of the wiring layer W3 provided on the third surface 51 of the flexible substrate 50 are in close contact with each other. As a result, the terminal W2*t* of the wiring layer W2 provided on the end surface 33 of the hard substrate 30 and the terminal W3*t* of the wiring layer W3 provided on the third surface 51 of the flexible substrate 50 may be easily and accurately soldered, and the electrical connection of these terminals may be made reliably.

Further, as shown in FIGS. 4A and 4B, the number of terminals connected by the solder S2 is greater than the number of terminals connected by the solder S1. Therefore, the area of the terminals W2*ta*, W2*tb*, W2*tc*, and W2*td* of the wiring layer W2 connected by the solder S2 is smaller than the area of the three terminals W1*ta*, W1*tb*, and W1*tc* of the wiring layer W1 provided on the first surface 31 of the hard substrate 30 connected by the solder S1. The smaller the area of the terminals, the more precision is required in the alignment of the terminals to be connected by soldering. Therefore, by forming the solder S2, in which the position alignment is more difficult, before the solder S1 by the above-mentioned procedure, the positional deviation between the terminals of the hard substrate 30 and the flexible substrate 50 may be reduced, and the hard substrate 30 and the flexible substrate 50 may be reliably connected electrically.

The embodiments described above are for facilitating the understanding of the disclosure, and are not for limiting the interpretation of the disclosure. Each element included in the embodiments and its disposition, material, condition, shape, size, and the like are not limited to those exemplified, and may be changed as appropriate. Further, it is possible to replace or combine a part of the configurations shown in different embodiments.

What is claimed is:

1. An electronic apparatus comprising:
   a hard substrate comprising:
     a first surface provided with a terminal of a first wiring layer;
     a second surface located on a back side of the first surface; and
     an end surface provided with a terminal of a second wiring layer and being continuous with the first surface and the second surface; and
   a flexible substrate comprising:
     a third surface provided with a terminal of a third wiring layer and facing the first surface of the hard substrate; and
     a fourth surface provided with a terminal of a fourth wiring layer and located on a back side of the third surface,
   wherein the terminal of the first wiring layer provided on the first surface of the hard substrate and the terminal of the fourth wiring layer provided on the fourth surface of the flexible substrate are electrically connected by solder, and
   the terminal of the second wiring layer provided on the end surface of the hard substrate and the terminal of the third wiring layer provided on the third surface of the flexible substrate are electrically connected by solder.

2. The electronic apparatus according to claim 1, wherein the flexible substrate is curved so that the third surface applies a restoring force to the first surface of the hard substrate.

3. The electronic apparatus according to claim 2, wherein the flexible substrate has a curved part in which the third surface is disposed on an outer side and the fourth surface is disposed on an inner side.

4. The electronic apparatus according to claim 1, wherein the terminal of the second wiring layer is provided in a recess of the end surface.

5. The electronic apparatus according to claim 4, wherein the recess configures a cylindrical surface whose axial direction is a direction perpendicular to the first surface and the second surface.

6. The electronic apparatus according to claim 1, wherein the second wiring layer is provided on the second surface of the hard substrate or inside the hard substrate.

7. The electronic apparatus according to claim 1, wherein the number of terminals of the second wiring layer and terminals of the third wiring layer that are electrically connected to each other is greater than the number of terminals of the first wiring layer and terminals of the fourth wiring layer that are electrically connected to each other.

8. A proximity sensor, comprising:
   a housing;
   the electronic apparatus according to claim 1, which is disposed inside the housing; and
   a detection part connected to the hard substrate.

9. A method of connecting a hard substrate and a flexible substrate,
   wherein the hard substrate comprises:
     a first surface provided with a terminal of a first wiring layer;
     a second surface located on a back side of the first surface; and
     an end surface provided with a terminal of a second wiring layer and being continuous with the first surface and the second surface,
   the flexible substrate comprises:
     a third surface provided with a terminal of a third wiring layer and facing the first surface of the hard substrate; and
     a fourth surface provided with a terminal of a fourth wiring layer and located on a back side of the third surface, and
   the method comprises:
     a step of electrically connecting the terminal of the second wiring layer provided on the end surface of the hard substrate and the terminal of the third wiring layer provided on the third surface of the flexible substrate by solder; and
     a step of electrically connecting the terminal of the first wiring layer provided on the first surface of the hard substrate and the terminal of the fourth wiring layer provided on the fourth surface of the flexible substrate by solder.

10. The electronic apparatus according to claim 2, wherein the terminal of the second wiring layer is provided in a recess of the end surface.

11. The electronic apparatus according to claim 3, wherein the terminal of the second wiring layer is provided in a recess of the end surface.

12. The electronic apparatus according to claim 10, wherein the recess configures a cylindrical surface whose axial direction is a direction perpendicular to the first surface and the second surface.

13. The electronic apparatus according to claim 11, wherein the recess configures a cylindrical surface whose axial direction is a direction perpendicular to the first surface and the second surface.

14. The electronic apparatus according to claim 1, wherein the second wiring layer is provided on the second surface of the hard substrate and inside the hard substrate.

15. The electronic apparatus according to claim 2, wherein the second wiring layer is provided on the second surface of the hard substrate or inside the hard substrate.

16. The electronic apparatus according to claim 2, wherein the second wiring layer is provided on the second surface of the hard substrate and inside the hard substrate.

17. The electronic apparatus according to claim 3, wherein the second wiring layer is provided on the second surface of the hard substrate or inside the hard substrate.

18. The electronic apparatus according to claim 3, wherein the second wiring layer is provided on the second surface of the hard substrate and inside the hard substrate.

19. The electronic apparatus according to claim 4, wherein the second wiring layer is provided on the second surface of the hard substrate or inside the hard substrate.

20. The electronic apparatus according to claim 4, wherein the second wiring layer is provided on the second surface of the hard substrate and inside the hard substrate.

* * * * *